(12) United States Patent
Okawa et al.

(10) Patent No.: US 8,304,991 B2
(45) Date of Patent: Nov. 6, 2012

(54) ORGANIC ELECTROLUMINESCENT ELEMENT SEALING COMPOSITION AND ORGANIC LIGHT-EMITTING DEVICE

(75) Inventors: Koji Okawa, Tokyo (JP); Osamu Tamura, Tokyo (JP)

(73) Assignee: Momentive Performance Materials Japan LLC, Tokyo (JP)

( * ) Notice: Subject to any disclaimer, the term of this patent is extended or adjusted under 35 U.S.C. 154(b) by 4 days.

(21) Appl. No.: 12/971,404

(22) Filed: Dec. 17, 2010

(65) Prior Publication Data

US 2012/0153818 A1 Jun. 21, 2012

(51) Int. Cl.
*H01J 1/63* (2006.01)
*C08L 83/07* (2006.01)

(52) U.S. Cl. ............. 313/512; 313/506; 445/24; 445/25
(58) Field of Classification Search ........... 313/501–512
See application file for complete search history.

(56) References Cited

U.S. PATENT DOCUMENTS

| 5,770,216 A * | 6/1998 | Mitchnick et al. | 428/402 |
| 2007/0212819 A1* | 9/2007 | Tamura et al. | 438/118 |
| 2009/0200930 A1* | 8/2009 | Hayashi | 313/504 |

FOREIGN PATENT DOCUMENTS

JP 2006-028386 A 2/2006

* cited by examiner

*Primary Examiner* — Tracie Y Green
(74) *Attorney, Agent, or Firm* — Foley & Lardner LLP

(57) ABSTRACT

This organic electroluminescent element sealing composition contains an addition reaction curing type silicone composition which is liquid at normal temperature and has a curing temperature of 100 degrees C. or below and a moisture content of 400 ppm or less. The addition reaction curing type silicone composition contains (A) polyorganosiloxane having an average of 0.2 to 5 alkenyl groups bonded to silicon atoms in one molecule, (B) polyorganohydrogensiloxane having at least two or more hydrogen atoms bonded to silicon atoms in one molecule, and (C) a platinum-based catalyst. The organic electroluminescent element sealing composition can prevent deterioration of the organic electroluminescent element and can provide the organic light-emitting device having a good light-emitting property for a long period.

4 Claims, 1 Drawing Sheet

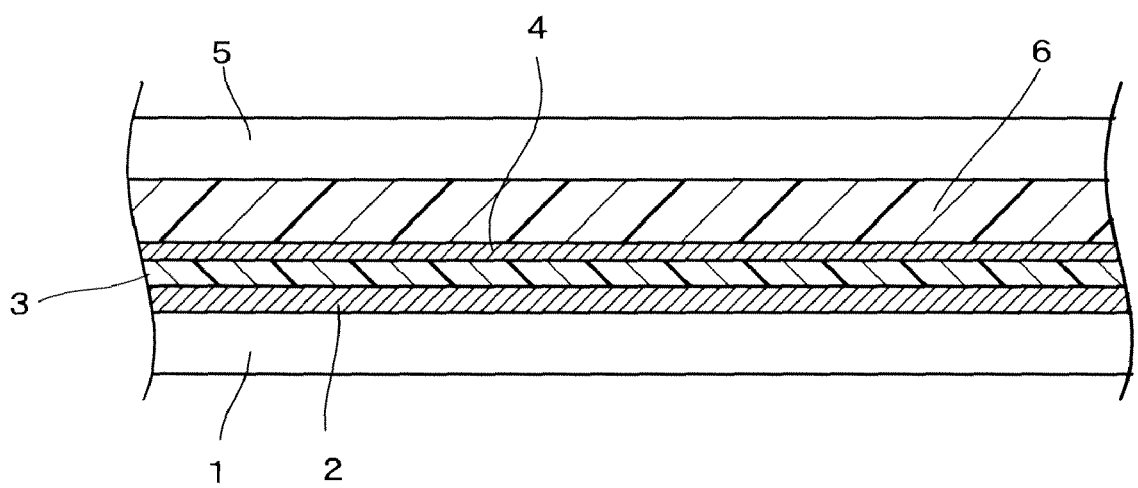

ORGANIC ELECTROLUMINESCENT ELEMENT SEALING COMPOSITION AND ORGANIC LIGHT-EMITTING DEVICE

BACKGROUND OF THE INVENTION

An organic EL (electroluminescent) element is a self-light-emission type electroluminescent element having a structure that an organic light-emitting medium layer is held between two electrode layers at least one of which has translucency and causes the organic light-emitting medium layer to emit light by applying a voltage between the electrodes. This organic EL element has advantages such as a wide viewing angle, a fast response speed and low power consumption, and therefore it is expected as a flat panel display used instead of a cathode-ray tube and a liquid crystal display.

But, the light-emitting medium layer of the organic EL element is composed of an organic material, and it is apt to be degraded by an influence of moisture, oxygen or heat in the atmosphere. Since this degradation lowers the light emitting performance of the organic EL element, display characteristics tend to be degraded. To prevent the organic EL element from deteriorating, there is adopted a structure that the top surface of the organic EL element formed on a glass substrate is covered by a glass substrate (glass cover) to form a hollow inner structure, and an adsorbing desiccant for moisture and the like is disposed within the hollow portion. And, there is also proposed a structure that the entire organic EL element is sealed with epoxy resin having low moisture permeability which is filled into the hollow portion between two glass substrates (see, for example, JP-A 2006-28386 (KOKAI)).

But, the structure that the adsorbing desiccant is disposed in the hollow portion cannot suppress sufficiently the organic EL element from degrading because the water-absorbing capacity of the desiccant is insufficient. The method of sealing with the epoxy resin filled into the hollow portion has problems that the organic EL element has a possibility of deterioration because the moisture contained in the epoxy resin is not controlled sufficiently and the organic EL element is deteriorated by heat applied at the time of curing because the epoxy resin has a high curing temperature.

The present invention has been achieved to solve the above-described problems, and the invention provides an organic electroluminescent element sealing composition capable of preventing deterioration of an organic electroluminescent element and an organic light-emitting device having a good light-emitting property for a long period.

SUMMARY OF THE INVENTION

According to an aspect of the present invention, there is provided an organic electroluminescent element sealing composition for sealing an organic electroluminescent element, which comprises an addition reaction curing type silicone composition which is liquid at normal temperature and has a curing temperature of 100 degrees C. or below and a moisture content of 400 ppm or less.

The organic light-emitting device of the present invention is provided with a first substrate; an organic electroluminescent element formed on the first substrate; a second substrate arranged to face the organic electroluminescent element formed surface of the first substrate; and a sealing layer filled between the first substrate and the second substrate to seal the organic electroluminescent element, wherein the sealing layer is a cured material of the organic electroluminescent element sealing composition of the present invention.

According to the organic electroluminescent element sealing composition, an addition reaction curing type silicone composition capable of curing at a low temperature of 100 degrees C. or below is used, and a moisture content (ratio) in the composition is prepared low to 400 ppm or less, so that deterioration of the organic electroluminescent element due to moisture contained in the sealing material itself and deterioration of the organic electroluminescent element due to heating for curing the sealing layer can be prevented. Therefore, the use of the sealing composition can provide formation of an excellent sealing layer without causing peeling and free from occurrence of a crack due to a temperature change, and can provide an organic electroluminescent element having an excellent light-emitting property free from defective light emission for a long period.

BRIEF DESCRIPTION OF THE DRAWING

FIG. 1 is a sectional view showing an example of an organic EL device for which the sealing composition of the present invention is used as a sealing material.

DETAILED DESCRIPTION OF THE INVENTION

Modes of conducting the present invention will be described below with reference to the drawing, which is provided for illustration only, and the present invention is not limited to the drawing.

The organic electroluminescent element sealing composition according to an embodiment of the present invention is comprises of an addition reaction curing type silicone composition which is liquid at normal temperature and has a moisture content (rate) of 400 ppm or below and a curing temperature of 100 degrees C. or below. This addition reaction curing type silicone composition contains (A) polyorganosiloxane having an average of 0.5 or more alkenyl group bonded to silicon atoms in one molecule, (B) polyorganohydrogensiloxane having 2 or more hydrogen atoms bonded to silicon atoms in one molecule, and (C) a platinum-based catalyst. The organic electroluminescent element sealing composition and the organic light-emitting device according to the embodiment are described below in detail.

[Component (A)]

Component (A) is a base polymer of an addition reaction curing type silicone composition and has an average of 0.5 or more alkenyl group bonded to silicon atom in one molecule in order to cure sufficiently the composition. It has an average of 0.6 or more alkenyl group preferably in one molecule, and more preferably an average of 2 or more alkenyl groups.

Examples of the silicon atom-bonded alkenyl group include a vinyl group, an allyl group, a butenyl group, a petenyl group and a hexenyl group, and the vinyl group is preferable. The alkenyl group may be bonded to the silicon atom at the molecular chain end, the silicon atom intermediate at the molecular chain or both of them. But from a view point of the curing rate of the composition to be obtained and the physical properties after curing, it is preferable that the alkenyl group is bonded to at least the silicon atoms at the molecular chain end, and particularly to the silicon atom at both terminal ends of the molecular chain.

Examples of the silicon atom-bonded organic group other than the alkenyl group of the component (A) include those having 1 to 12 carbon atoms, and preferably 1 to 8 carbon atoms, which are an alkyl group such as a methyl group, an ethyl group, a propyl group, etc.; a cycloalkyl group such as a cyclopentyl group, a cyclohexyl group, etc.; an aryl group such as a phenyl group, a tolyl group, a xylyl group, etc.; or a halogenated hydrocarbon group or the like having the above hydrogen atoms substituted partly by chlorine atoms, fluorine atoms or the like. The silicon atom-bonded organic group is preferably an alkyl group or an aryl group, and more preferably a methyl group or a phenyl group.

The component (A) is not limited to having a particular molecular structure but has, for example, a linear, cyclic, branched or another structure. The linear structure is preferable from a view point of mechanical strength or the like of the cured material. And, as the component (A), one of them can be used alone, or two or more of them can also be used in combination.

The viscosity of the component (A) at 23 degrees C. is 10 to 1,000,000 mPa·s, and preferably 100 to 1,000,000 mPa·s. When it is less than 10 mPa·s, the mechanical strength after curing tends to decrease. Meanwhile, when it exceeds 1,000,000 mPa·s, workability of the composition tends to become low.

[Component (B)]

Polyorganohydrogensiloxane of component (B) is a cross-linking agent of the component (A) and has two or more, and preferably three or more hydrogen atoms (SiH groups) bonded to silicon atoms in one molecule. This SiH group may be at the ends of the molecular chain, intermediate the molecular chain or both.

For example, the component (B) is expressed by an average composition formula $R_sH_tSiO_{[4-(s+t)]/2}$ ... (1). In the formula (1), R is the same or different substituted or non-substituted univalent hydrocarbon group not having an aliphatic unsaturated bond. Examples of R include an alkyl group such as a methyl group, an ethyl group, a propyl group, an isopropyl group, a butyl group, an isobutyl group, a tert-butyl group, a hexyl group, a cyclohexyl group or an octyl group; an aryl group such as a phenyl group or a tolyl group; an aralkyl group such as a benzyl group or a phenylethyl group; and a group which has part or all of the hydrogen atoms in the above groups substituted by a halogen atom such as a fluorine, chlorine or bromine atom, or a cyano group, and its examples include groups having 1 to 12 carbon atoms, such as a chloromethyl group, a bromoethyl group, a trifluoropropyl group and a cyanoethyl group. Among them, the alkyl group having 1 to 4 carbon atoms, such as a methyl group, an ethyl group, a propyl group, an isopropyl group, a butyl group or an isobutyl group, is preferable, and the methyl group is more preferable from viewpoints of easiness of synthesis and cost.

In the formula (1), s and t are positive numbers satisfying $0.5 \leq s \leq 2.2$, $0 \leq t \leq 2$ and $0.5 < s+t \leq 3$, and preferably positive numbers satisfying $0.6 \leq s \leq 2.0$, $0.01 \leq t \leq 1.8$ and $0.6 \leq s+t \leq 2.8$.

The molecular structure of the component (B) may be any of a linear, branched, cyclic or three-dimensional network structure. The viscosity of the component (B) is 5,000 mPa·s or less, and preferably 1 to 1,000 mPa·s, at 23 degrees C.

Examples of the component (B) include 1,1,3,3-tetramethyl-1,3-dihydrogensiloxane, methylhydrogen cyclic polysiloxane, methylhydrogensiloxane-dimethylsiloxane cyclic copolymers, both end trimethylsiloxy-blocked methylhydrogenpolysiloxane, both end trimethylsiloxy-blocked dimethylsiloxane-methylhydrogenpolysiloxane copolymers, both end dimethylhydrogensiloxy-blocked dimethylsiloxane, both end dimethylhydrogensiloxy-blocked dimethylsiloxane-methylhydrogensiloxane copolymer, both end trimethylsiloxy-blocked methylhydrogensiloxane-diphenylsiloxane copolymers, both end trimethylsiloxy-blocked methylhydrogensiloxane-diphenylsiloxane-dimethylsiloxane copolymer, both end dimethylhydrogensiloxy-blocked methylhydrogensiloxane-diphenylsiloxane-dimethylsiloxane copolymer, a copolymer of $(CH_3)_2HSiO_{1/2}$ unit and $SiO_{4/2}$ unit, a copolymer of $(CH_3)_2HSiO_{1/2}$ unit, $SiO_{4/2}$ unit and $(C_6H_5)SiO_{3/2}$ unit, and the like.

The blending amount of the component (B) is an amount that hydrogen atoms (SiH group) bonded to the silicon atoms of the component (B) relative to one alkenyl group of the component (A) become 0.2 to 5.0, and preferably 0.5 to 3.0. When the SiH group of the component (B) is less than 0.2, sufficient cross-linking cannot be obtained. When it exceeds 5.0, an unreacted SiH group remains, and the physical properties of the cured material tend to become instable.

[Component (C)]

As a platinum-based catalyst which is component (C), the known platinum-based catalyst used for the hydrosilylation reaction can be used. Its examples include platinum black, platinum chloride, chloroplatinic acid, a reactant of chloroplatinic acid and monohydric alcohol, a complex of chloroplatinic acid and olefins or vinylsiloxane, platinum bisacetoacetate and the like.

The blending amount of the component (C) can be adjusted appropriately depending on the desired curing rate or the like. It is normally 0.1 to 1,000 ppm, and preferably 0.5 to 500 ppm, in terms of a platinum element relative to the total amount of the composition.

[Other Optional Components]

An addition reaction curing type silicone composition which is a sealing composition of the embodiment and in a liquid state at normal temperature has the above-described components (A) to (C) as the basic components, and if necessary, a filler, a reaction inhibitor, a flame retardance-imparting agent, a heat resistance improving agent, an adhesion-imparting agent, a thixotropy imparting agent, a pigment, a plasticizer, etc. may be added as optional components in a range not impairing the object of the invention.

Examples of the filler include silica, titanium oxide and the like. A blending amount of the filler is adequate when it is in a range that the workability is kept fine and the properties of the cured material are not impaired, and it is preferably 1 to 50 parts by weight relative to 100 parts by weight of the component (A).

Examples of the reaction inhibitor include acetylene alcohol such as 3,5-dimethyl-1-hexyn-3-ol, 2-methyl-3-hexyn-2-ol or 1-ethynyl-1-cyclohexanol, 3-methyl-3-pentene-1-yne, 3,5-dimethyl-3-hexene-1-yne or the like, or a methylvinylsiloxane cyclic compound, an organic nitrogen compound, an organic phosphorus compound or the like. A blending amount of the reaction inhibitor is adequate when it is in a range that curing reactivity and preservation stability are kept good, and the properties of the cured material are not impaired, and it is preferably 0.001 to 1 part by weight relative to 100 parts by weight of the component (A).

[Sealing Composition and its Production Method]

To produce the sealing composition of the embodiment, polyorganohydrogensiloxane which is the component (B) (cross-linking agent) and other optional components are added to the alkenyl group-containing polyorganosiloxane which is the component (A), the platinum-based catalyst (C) is further added, and they are kneaded by a known kneader at normal temperature or while heating (e.g., 80 to 200 degrees C.), if necessary. As the kneader, a known device provided with a heating means and a cooling means can be used. For example, a planetary mixer, a triple roll, a Shinagawa mixer, a Tri-mix, a Twin-mix and the like can be used alone or in combination.

The sealing composition of the embodiment obtained as described above has a curing temperature of normal temperature (normally 23 degrees C.) or higher and 100 degrees C. or below. And, a moisture content (rate) in the composition is adjusted to fall in a range of 400 ppm or less. When the curing temperature of the composition is lower than normal temperature, workability becomes poor because curing takes long time. When the curing temperature exceeds 100 degrees C., the organic electroluminescent element is easily degraded by heat when curing by heating, and it is highly probable that an effective pixel area of the organic light-emitting device is reduced. In addition, it is not desirable when the moisture content (rate) exceeds 400 ppm because it becomes highly possible that the organic electroluminescent element is deteriorated with water produced from the composition that is used as the sealing material.

To adjust the moisture content of the composition to the above-described range, there can be adopted a method of heating at least one of the component (A) and the component (B) while controlling the temperature and time prior to blending and kneading. It is especially preferable to adopt a method of heating the component (A) under reduced pressure. In other words, it is preferable that the moisture content in the composition is adjusted to 400 ppm or less by evaporating/volatilizing the moisture in the component (A), by heating the component (A) with the pressure reduced, if necessary. And, if the moisture content in the composition finally obtained can be suppressed to 400 ppm or less, it is also possible to add water to the composition to be obtained after kneading the component (A) undergone the heating treatment with the other components.

It is also preferable that the sealing composition of the embodiment has a viscosity of 10 to 1,000,000 mPa·s at 23 degrees C.

[Cured Material of Sealing Composition]

The sealing composition of the embodiment according to the invention is cured by heating at a temperature of 100 degrees C. or below for 5 to 120 minutes (e.g., at 80 degrees C. for 60 minutes). Since the sealing composition cures in the allowable temperature range (100 degrees C. or below) of the organic electroluminescent element (organic EL element), it can be used suitably as the sealing material for sealing the organic EL element. For the composition forming and curing methods, curing conditions and the like, known methods and conditions can be applied.

[Organic Light-emitting Device]

The organic EL device for which the sealing composition of the embodiment is used as the sealing material has a structure as shown in for example FIG. 1 that a first electrode (anode) layer 2, an organic EL element comprising the organic EL layer 3 as an organic light-emitting medium and a second electrode (cathode) layer 4 are formed on a first substrate 1 of glass or the like, and a second substrate 5 such as a glass cover is disposed to face the organic EL element. And, as a sealing layer, a cured material layer 6 of the sealing composition of the embodiment is filled and formed within the second substrate 5 (between the second substrate 5 and the organic EL element).

In the organic EL device, a barrier layer (protective layer) for blocking oxygen and moisture can be disposed between the cured material layer 6 of the sealing composition and the organic EL element. The material forming the barrier layer is silicon nitride, silicon oxide, silicon oxynitride or the like. As a method of forming the barrier layer, there is used a resistance heating deposition method, an electron beam deposition method, a reactive deposition method, an ion plating method, a sputtering method, a CVD method or the like.

EXAMPLES

While the present invention is described with reference to specific examples, it is to be understood that the invention is not limited to the described examples.

Examples 1 to 3 and Comparative Examples 1 and 2

First, (A) 100 parts by weight of polydimethylsiloxane which had a viscosity of 3000 mPa·s at 23 degrees C. and had both terminal ends of the molecular chain blocked by a dimethylvinyl siloxy group were thermally treated under reduced pressure of 10 mmHg at a temperature of 150 degrees C. for two hours. Then, the 100 parts by weight of the polydimethylsiloxane undergone the thermal treatment were added with (B) 1.5 parts by weight (a molar ratio (H/Vi ratio) of hydrogen groups in the component (B) and vinyl groups in the component (A) is 1.5) of polymethylhydrogensiloxane having hydrogen groups (about 20 hydrogen groups in one molecule) at a ratio of 50 mol % at side chains and (C) 10 ppm (platinum amount) of a vinylsiloxane complex compound of chloroplatinic acid, and 0.05 part by weight of 1-ethynyl-1-cyclohexanol, and they were kneaded homogeneously at room temperature. Thus, the silicone compositions of Example 1 and Example 2 were obtained.

In Example 3 and Comparative Example 2, water was added to the silicone composition obtained in Example 1 to increase a moisture content. And, the component (A) was not thermally treated in Comparative Example 1, but the component (A) in normal storage was used as it was to obtain the silicone composition.

Subsequently, the silicone compositions of Examples 1 to 3 and Comparative Examples 1 and 2 were measured for moisture contents by a Karl Fischer moisture measuring apparatus (Model KF-06 of Mitsubishi Kasei Corporation). The measured results are shown together with curing temperatures described later in Table 1.

The silicone compositions obtained in Examples 1 to 3 and Comparative Examples 1 and 2 were used to seal the organic EL elements. First, an organic EL element was produced. Specifically, a pattern of an ITO film (thickness of 150 nm) which was a first electrode layer was formed on a glass substrate by sputtering. A mixture (thickness of 20 nm) of poly(3,4-ethylenedioxythiophene) and polystyrene sulfonate was spin-coated as a hole-transporting layer, poly[2-methoxy-5-(2'-ethylhexyloxy)-1,4-phenylenevinylene] (MEH-PPV) (thickness of 100 nm) was spin-coated as a light-emitting layer, and unnecessary portions were removed from the hole-transporting layer by methanol and from the light-emitting layer by toluene to form a pattern of the organic light-emitting medium layer. Then, a Ca film (thickness of 5 nm) and an Al film (thickness of 150 nm) were laminated as a second electrode layer by a vapor deposition method. In addition, a silicon nitride film (500 nm) was formed as a barrier layer (protective layer) by a plasma CVD method.

Subsequently, the silicone compositions obtained in Examples 1 to 3 and Comparative Examples 1 and 2 were coated on the obtained individual organic EL elements, and a glass cover was applied to them. The coated layers of the silicone compositions of Examples 1 and 3 and Comparative Examples 1 and 2 were cured by heating to 80 degrees C. The coated layer of the silicone composition of Example 2 was cured by heating to 100 degrees C. The produced organic EL panels were examined for the effective pixel area of the organic EL element. And, a long-term storage test was performed at 85 degrees C. for 500 hours to examine the effective pixel area after the long-term test. The measured results are shown in Table 1.

Comparative Example 3

The organic EL element was sealed in the same manner as in Example 1 except that an epoxy resin (EH1600-G2 of Inabata & Co., Ltd.) was used instead of the silicone composition. The used epoxy resin was measured for a moisture content (rate) to find that it was 100 ppm as shown in Table 1. The sealing layer was formed by curing the epoxy resin by heating it to 120 degrees C. Then, the produced organic EL panel was measured for the effective pixel area of the organic EL element. The effective pixel area after the long-term test (500-hour storage at 85 degrees C.) was also examined. The measured results are shown in Table 1.

TABLE 1

|  | Example 1 | Example 2 | Example 3 | Comp. Ex. 1 | Comp. Ex. 2 | Comp. Ex. 3 |
|---|---|---|---|---|---|---|
| Component (A) | | | | | | |
| Polydimethylsiloxane with viscosity of 3000 mPa · s (23° C.) having a vinyl group at both terminal ends | 100 | 100 | 100 | 100 | 100 | |
| Component (B) | | | | | | |
| Polymethylhydrogensiloxane having 50 mol % of hydrogen groups at side chains | 1.5 | 1.5 | 1.5 | 1.5 | 1.5 | |
| Component (C) | | | | | | |
| Vinylsiloxane complex compound of chloroplatinic acid (platinum amount) | (10 ppm) | (10 ppm) | (10 ppm) | (10 ppm) | (10 ppm) | |
| Other optional components | | | | | | |
| 1-ethynyl-1-cyclohexanol | 0.05 | 0.05 | 0.05 | 0.05 | 0.05 | |
| Epoxy resin | | | | | | 100 |
| H/Vi | 1.5 | 1.5 | 1.5 | 1.5 | 1.5 | |
| Water amount (ppm) | 50 | 50 | 400 | 800 | 5000 | 100 |
| Curing temperature (° C.) | 80 | 100 | 80 | 80 | 80 | 120 |
| Effective pixel area (%) of organic EL | | | | | | |
| Early stage | 100 | 100 | 100 | 100 | 70 | 50 |
| After long-term test (85° C. × 500 hrs) | 100 | 99 | 99 | 70 | 20 | 30 |

Comp. Ex. = Comparative Example

It is seen from Table 1 that the organic EL panels having the sealing layers formed by using the silicone compositions obtained in Examples 1 to 3 did not have a reduction in the effective pixel area of the organic EL element after the long-term test. On the other hand, the organic EL panels having the sealing layers formed by using the silicone compositions obtained in Comparative Example 1 and Comparative Example 2 had a reduction in the effective pixel area due to the moisture contained in the compositions after the long-term test. And, the organic EL panel having the sealing layer formed of the silicone composition of Comparative Example 2 had a reduction in the effective pixel area even at an early stage before the long-term test. In addition, the organic EL panels having the sealing layer, which was formed by using the epoxy resin of Comparative Example 3, had the effective pixel area of the organic EL element considerably degraded due to heating at the time of forming the sealing layer, and some of them had cracks partly and the effective pixel area was further reduced when the long-term test was completed.

What is claimed is:

1. An organic electroluminescent element sealing composition, containing:

an addition reaction curing type silicone composition which is liquid at normal temperature and has a curing temperature of 100 °C. or below and a moisture content of 400 ppm or less;

wherein the addition reaction curing type silicone composition contains
   (A) polyorganosiloxane having an average of 0.5 or more alkenyl group bonded to silicon atom in one molecule,
   (B) poloyorganohydrogensiloxane having 2 or more hydrogen atoms bonded to silicon atoms in one molecule, and
   (C) a platinum-based catalyst.

2. The organic electroluminescent element sealing composition according to claim 1,
   wherein a blending amount of the component (B) is an amount that the hydrogen atoms bonded to the silicon atoms of the component (B) become 0.2 to 5.0 relative to one alkenyl group of the component (A).

3. An organic light-emitting device, comprising
   a first substrate,
   an organic electroluminescent element formed on the first substrate,
   a second substrate disposed to face the organic electroluminescent element forming surface of the first substrate, and
   a sealing layer filled between the first substrate and the second substrate to seal the organic electroluminescent element,
   wherein the sealing layer is a cured material of the organic electroluminescent element sealing composition according to claim 1.

4. The organic light-emitting device according to claim 3, wherein a barrier layer for blocking oxygen and moisture is disposed between the sealing layer and the organic electroluminescent element.

* * * * *